(12) United States Patent
Harrison et al.

(10) Patent No.: US 12,512,406 B2
(45) Date of Patent: Dec. 30, 2025

(54) BACK END OF LINE STRUCTURE FOR IMPROVED CURRENT DENSITY IN HR DEVICES

(71) Applicant: TEXAS INSTRUMENTS INCORPORATED, Dallas, TX (US)

(72) Inventors: William Harrison, Apex, NC (US); Sylvester Ankamah-Kusi, Dallas, TX (US); Yiqi Tang, Allen, TX (US); Rajen M. Murugan, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 371 days.

(21) Appl. No.: 17/820,020

(22) Filed: Aug. 16, 2022

(65) Prior Publication Data
US 2024/0063118 A1 Feb. 22, 2024

(51) Int. Cl.
| | |
|---|---|
| H01L 23/528 | (2006.01) |
| H01L 21/768 | (2006.01) |
| H01L 23/00 | (2006.01) |
| H01L 23/522 | (2006.01) |

(52) U.S. Cl.
CPC ...... *H01L 23/528* (2013.01); *H01L 21/76885* (2013.01); *H01L 23/5226* (2013.01); *H01L 24/13* (2013.01); *H01L 2224/13025* (2013.01); *H01L 2224/13147* (2013.01)

(58) Field of Classification Search
CPC ............. H01L 23/528; H01L 21/76885; H01L 23/5226
See application file for complete search history.

(56) References Cited

U.S. PATENT DOCUMENTS 6,436,734 B1 * 8/2002 Lin ..................... H01L 23/4985
257/E23.068
6,544,813 B1 * 4/2003 Lin ........................ H01L 24/12
257/E23.021
(Continued)

FOREIGN PATENT DOCUMENTS

CN 115668763 A * 1/2023 ......... H10D 62/8325
WO WO-2019132965 A1 * 7/2019 ............. H01L 24/17
(Continued)

*Primary Examiner* — Laura M Menz
(74) *Attorney, Agent, or Firm* — Xiaotun Qiu; Frank D. Cimino

(57) ABSTRACT

A semiconductor device is described herein. The semiconductor device generally includes a metal fabrication layer disposed on a substrate. The semiconductor device generally includes a dielectric layer having a first plurality of vias aligned with a first metallization region of the metal fabrication layer and a second plurality of vias aligned with a second metallization region of the metal fabrication layer, the dielectric layer disposed on top of the metal fabrication layer. The semiconductor device generally includes a metal layer disposed on the dielectric layer and having a plurality of metal routings, each of the metal regions disposed over both the first metallization region and the second metallization region, each of the plurality of metal routings have a same width. The semiconductor device generally includes an insulation layer disposed on the metal layer, the insulation layer having a plurality of openings to the metal routings of the metal layer.

13 Claims, 11 Drawing Sheets

(56) References Cited

U.S. PATENT DOCUMENTS

| | | | | |
|---|---|---|---|---|
| 8,349,721 | B2* | 1/2013 | Shim | H01L 23/49811 |
| | | | | 257/E23.021 |
| 8,350,384 | B2* | 1/2013 | Pendse | H01L 24/32 |
| | | | | 257/781 |
| 8,803,206 | B1* | 8/2014 | Or-Bach | H10D 84/016 |
| | | | | 257/355 |
| 8,946,900 | B2* | 2/2015 | Qian | H01L 25/105 |
| | | | | 257/762 |
| 9,240,377 | B2* | 1/2016 | Qian | H01L 23/5381 |
| 9,859,245 | B1* | 1/2018 | Chen | H01L 21/6835 |
| 10,541,220 | B1* | 1/2020 | Komatsu | H01L 24/13 |
| 10,748,847 | B2* | 8/2020 | Huiskamp | H01L 23/522 |
| 10,867,909 | B1* | 12/2020 | Tsai | H01L 21/76877 |
| 12,230,539 | B2* | 2/2025 | Komatsu | H01L 24/03 |
| 2006/0033210 | A1* | 2/2006 | Chauhan | H05K 3/3436 |
| | | | | 257/E21.511 |
| 2008/0185724 | A1* | 8/2008 | Tseng | H01L 23/53238 |
| | | | | 257/762 |
| 2011/0175211 | A1* | 7/2011 | Cabral, Jr. | H01L 23/556 |
| | | | | 257/776 |
| 2014/0117552 | A1* | 5/2014 | Qian | H01L 23/5383 |
| | | | | 257/E23.141 |
| 2015/0102477 | A1* | 4/2015 | Qian | H01L 25/105 |
| | | | | 257/676 |
| 2016/0181215 | A1* | 6/2016 | Sullivan | G06F 30/394 |
| | | | | 257/737 |
| 2017/0117260 | A1* | 4/2017 | Prabhu | H01L 24/20 |
| 2020/0043778 | A1* | 2/2020 | Komatsu | H01L 23/5329 |
| 2020/0043878 | A1* | 2/2020 | Komatsu | H01L 21/4825 |
| 2020/0251436 | A1* | 8/2020 | Williamson | H01L 21/481 |
| 2020/0266169 | A1* | 8/2020 | Kang | H10D 84/0149 |
| 2020/0381356 | A1* | 12/2020 | Tsai | H01L 21/76802 |
| 2022/0122936 | A1* | 4/2022 | Williamson | H01L 24/73 |
| 2022/0181256 | A1* | 6/2022 | Gomes | H01L 23/481 |
| 2023/0163098 | A1* | 5/2023 | Elsherbini | H01L 25/0652 |
| | | | | 257/532 |
| 2023/0178513 | A1* | 6/2023 | Jun | H01L 24/24 |
| | | | | 257/668 |
| 2023/0317658 | A1* | 10/2023 | Guevara | H01L 24/13 |
| | | | | 257/108 |
| 2023/0335535 | A1* | 10/2023 | Or-Bach | H01L 25/50 |
| 2023/0395572 | A1* | 12/2023 | Or-Bach | H01L 21/743 |
| 2023/0411262 | A1* | 12/2023 | Lopez | H01L 23/3107 |
| 2024/0063118 | A1* | 2/2024 | Harrison | H01L 23/5226 |
| 2024/0105710 | A1* | 3/2024 | You | H01L 23/5226 |
| 2024/0222333 | A1* | 7/2024 | Or-Bach | H10D 87/00 |
| 2024/0304521 | A1* | 9/2024 | Chen | H10D 84/85 |
| 2024/0387431 | A1* | 11/2024 | Chen | H01L 24/19 |
| 2024/0404951 | A1* | 12/2024 | Chung | H01L 23/481 |
| 2024/0404973 | A1* | 12/2024 | Arshad | H01L 21/565 |
| 2025/0070091 | A1* | 2/2025 | Or-Bach | H10D 88/00 |

FOREIGN PATENT DOCUMENTS

| | | | | |
|---|---|---|---|---|
| WO | WO-2023208844 | A1 * | 11/2023 | ....... H01L 23/49816 |
| WO | WO-2025020187 | A1 * | 1/2025 | ......... H01F 27/2804 |

* cited by examiner

BACK END OF LINE STRUCTURE FOR IMPROVED CURRENT DENSITY IN HR DEVICES

TECHNICAL FIELD

Examples of the present disclosure generally relate to semiconductor devices and, in particular, to back end of line structures of semiconductor devices.

BACKGROUND

During manufacture, semiconductor chips (also commonly referred to as "dies") are typically mounted on die pads of lead frames and are wire-bonded, clipped, or otherwise coupled to leads of the lead frame. Other devices may similarly be mounted on a lead frame pad. The assembly is later covered in a mold compound, such as epoxy, to protect the assembly from potentially damaging heat, physical trauma, moisture, and other deleterious factors. The finished assembly is called a semiconductor package or, more simply, a package. The leads are exposed to surfaces of the package and are used to electrically couple the packaged chip to devices outside of the chip.

However, other types of packages, commonly known as flip-chip packages, are configured differently than described above. Flip-chip packages include a die, metallic bumps (e.g., solder bumps), and a dielectric layer (RDL) that interfaces between the die and the metallic bumps so that signals are routed appropriately between the bumps and the active circuitry formed on the die. Examples of such flip-chip packages include chip scale packages (CSPs), such as wafer chip scale packages (WCSPs).

FIG. 1A is a schematic diagram of an electronic device including a CSP implementing a back end of line (BEOL) structure. FIG. 1B is a top view of the BEOL layer 108 of the CSP 104 of the electronic device 100. The electronic device 100 is a device, such as a laptop or notebook computer, a workstation, a smartphone, an automobile, an aircraft, or a television. The electronic device 100 includes a printed circuit board (PCB) 102. The PCB 102 typically includes conductive terminals (not illustrated) (e.g., copper pads or traces) that facilitate coupling to such electronic components. The electronic device 100 includes a CSP 104 coupled to the conductive terminals. FIG. 1A shows the contents of the electronic device 100 in a profile, cross-sectional view.

The CSP 104 includes a semiconductor die 106 that is coupled to a BEOL layer 108. The BEOL layer 108 couples to copper posts 118. The copper posts 118, in turn, coupled to conductive terminals of the PCB 102 via solder 120. In this way, the circuitry of the semiconductor die 106 is configured to communicate with circuitry on the PCB 102 via the copper posts 118 and the BEOL layer 108.

The size of the CSP 104 is determined at least in part by the topological efficiency of the BEOL layer 108.

The CSP 104 with the BEOL layer 108 is mounted and attached on a leadframe 122 via copper posts 118. The leadframe 122 with the mounted and attached CSP 104 with BEOL layer 108 is then attached to the PCB 102.

In operation, electrical signals flow between the semiconductor die 106 and the PCB 102 via the leadframe 122, solder 120, copper posts 118, metal layer 116, vias 114 of the dielectric layer, and the BEOL layer 108 of the semiconductor die 106.

As illustrated in FIG. 1A, the BEOL layer 108 includes a metallization layer 110. The metallization structure 110 includes multiple fabrication metallization layers. The metallization layer 110 includes dielectric material between the fabrication metallization layers that separate the fabrication metallization layers. The metallization layer 110 includes vias between the fabrication metallization layers of the metallization layers. The vias connect the fabrication metallization layers, and the vias of the metallization layer 110.

As illustrated in FIG. 1A, the metallization layer 110 also includes a top-most fabrication metallization layer 112. While the top-most fabrication metallization layer 112 is referred to as the top-most, the top-most fabrication metallization layer 112 of the metallization layer 110 is the fabrication metallization layer furthest away from the semiconductor die 106. The top-most fabrication metallization layer 112 has two different sets of routings: routings coupled to a source of a transistor of the semiconductor die 106, and routings coupled to a drain of a transistor of the semiconductor die 106. Accordingly, in operation, the top-most fabrication metallization layer 112 includes metal regions having a source voltage and metal regions having a drain voltage.

The BEOL layer 108 includes a layer of vias 114 (also referred to as VIATOP layer 114) coupled to the topmost fabrication metallization layer 112 of the metallization layer 110. The layer of vias 114 are disposed in a dielectric material disposed on the topmost fabrication metallization layer 112. Like other vias, the layer of vias 114 couples the topmost fabrication metallization layer 112 to the top metal layer 116. The vias 114 are placed and positioned between the top-most fabrication metallization layer 112 and the top metal layer 116 to distribute current to the top metal layer 116. Further, as illustrated in FIG. 1B, the layer of vias 114 are arranged in groups to couple to different regions of the top-most fabrication metallization layer 112.

As illustrated in FIG. 1B, the BEOL layer 108 includes a top metal layer 116. As illustrated in FIG. 1B, the top metal layer 116 includes multiple routings. The routings of the top metal layer 116 are routed in a different direction than that of the routings of the top-most fabrication metallization layer 112. For example, the routings of the top-most fabrication metallization layer 112 are routed vertically (as illustrated in FIG. 1B), and thus the routings of the top metal layer 116 are routed horizontally. The top metal layer 116 is coupled to the layer of vias 114, and accordingly, the vias 114 are arranged based on the routings of the top-most fabrication metallization layer 112 and the routings of the top metal layer 116. The arrangement of vias of the layer of vias 114 is based on connections to the circuitry of the semiconductor die 106. For example, for one routing of the top metal layer, the vias of the layer of vias 114 are arranged to only couple to one of the regions of the top-most fabrication metallization layer 112: either the metal regions of the top-most fabrication metallization layer 112 coupled to a source voltage or the metal regions of the top-most fabrication metallization layer 112 coupled to a drain voltage. As illustrated, each routing of the top metal layer 116 is coupled to a group of vias of the layer of vias 114 that are in turn coupled to only regions of the top-most fabrication metallization layer 112 of the same voltage. Further, the routings of the top metal layer 116 alternate coupling to different regions of the top-most fabrication metallization layer 112. For example, one routing of the top metal layer 116 may be coupled to routings of the top-most fabrication metallization layer 112 having a source voltage, and the adjacent routings of the top metal layer 116 are coupled to routings of top-most fabrication metallization layer 112 having a drain voltage.

The top metal layer 116 is coupled to copper posts 118. The top metal layer 116 provides external electrical connections, via the copper posts, to the semiconductor die 106. Each of the multiple routings of the top metal layer 116 is coupled to a copper post 118. Despite the top metal layer 116 appearing to having a same width from the cross-sectional view of FIG. 1A, the routings of the top metal layer 116 have non-uniform widths as illustrated in FIG. 1B. The nonuniform widths of the routings of the top metal layer 116 is required by conventional rules for solder bumps (or in the illustrated case, copper posts 118).

Conventionally, copper posts 118 or bumps (not illustrated) are coupled to the routings of the top metal layer 116, and the routings of the top metal layer 116 needed to accommodate the size of copper posts 118 or bumps. Because the routings of the top metal layer 116 are coupled to different features of the semiconductor die 106, as illustrated in FIG. 1B, copper posts 118 or bumps are coupled to only one routing of the top metal layer 116 because otherwise, the copper posts 118 or bumps would cause a short to the semiconductor die 106. Because of the size of the copper posts 118 or bumps, as illustrated in FIG. 1B, the copper posts 118 are centered (width-wise) on the routings of the top metal layer 116 to avoid overlapping with another routing of the top metal layer 116. Accordingly, the shape of the routings of the top metal layer 116 need to accommodate the copper posts 118, and thus, the routings of the top metal layer 116 has non-uniform widths. If viewed from a top view, the routings of the top metal layer 116 have a wave or sinusoidal shape as illustrated in FIG. 1B.

Because of the shape of the routings of the top metal layer 116, vias of the layer of vias 114 are spaced far apart with relation to routings of the topmost fabrication metallization layer 112. As illustrated in FIG. 1B, the largest distance between vias coupled to different routings of the top metal layer 116 is greater than the largest width of a routing of the top metal layer 116. For example, for one routing of the top-most fabrication metallization layer 112, the routing of the top-most fabrication metallization layer 112 is coupled to different routings of the top metal layer 116. In such example, the different routings are separated by another routing of the top metal layer 116, and so the vias of the different routings are separated by different distances based on the non-uniform width of the routing. Accordingly, the distance that current travels between vias 114 along routings of the top-most fabrication metallization layer 112 depends on the non-uniform width of the routings of the top metal layer 116. The distance that current travels is greatest at the widest parts of the routings of the top metal layer 116, and thus, more current accumulates in the corresponding routing of the top-most fabrication metallization layer 112.

SUMMARY

This Summary is provided to comply with 37 C.F.R. § 1.73, requiring a summary of the invention briefly indicating the nature and substance of the invention. It is submitted with the understanding that it will not be used to interpret or limit the scope or meaning of the claims.

Certain aspects of the subject matter described in this disclosure can be implemented in a semiconductor device. The semiconductor device generally includes a metal fabrication layer disposed on a substrate, the metal fabrication layer having a first metallization region and a second metallization region. The semiconductor device generally includes a dielectric layer having a first plurality of vias aligned with the first metallization region of the metal fabrication layer and a second plurality of vias aligned with the second metallization region of the metal fabrication layer, the dielectric layer disposed on top of the metal fabrication layer. The semiconductor device generally includes a metal layer disposed on the dielectric layer, the metal layer having a plurality of metal routings, each of the metal routings disposed over both the first metallization region of the metal fabrication layer and the second metallization region of the metal fabrication layer, each of the plurality of metal routings have a same width. The semiconductor device generally includes an insulation layer disposed on the metal layer, the insulation layer having a plurality of openings to the metal routings of the metal layer.

Certain aspects of the subject matter described in this disclosure can be implemented in a structure. The structure includes a layer of vias coupled to a plurality of first metal regions of a metal layer and to a plurality of second metal regions of the metal layer. The structure generally includes a top metal layer comprising a plurality of top metal routings, at least one of the plurality of top metal routings disposed over each of the plurality of second metal regions and each of the plurality of first metal regions, the top metal layer disposed over each of the layer of vias. The structure generally includes an insulation layer on the top metal layer, the insulation layer having a plurality of openings, each of the plurality of openings aligned with at least one via of the layer of vias. The plurality of second metal regions and the plurality of top metal routings form a plurality of second intersections, the plurality of first metal regions and the plurality of top metal routings form a plurality of first intersections. Each of the plurality of second intersections generally includes a first plurality of vias coupling the respective second metal region to the respective top metal routing, wherein each first plurality of vias has a same number of vias. Each of the plurality of first intersections generally includes a second plurality of vias coupling the respective first metal region to the respective top metal routing, wherein each second plurality of vias has a same number of vias.

Certain aspects of the subject matter described in this disclosure can be implemented in a method for manufacturing a semiconductor device. The method generally includes forming a metallization layer having a first metal region and a second metal region. The method generally includes forming a layer of vias coupled to the first metal region and the second metal region of the metallization layer. The method generally includes forming a top metal layer having a plurality of metal routings, each of the plurality of metal routings having uniform width.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1A:
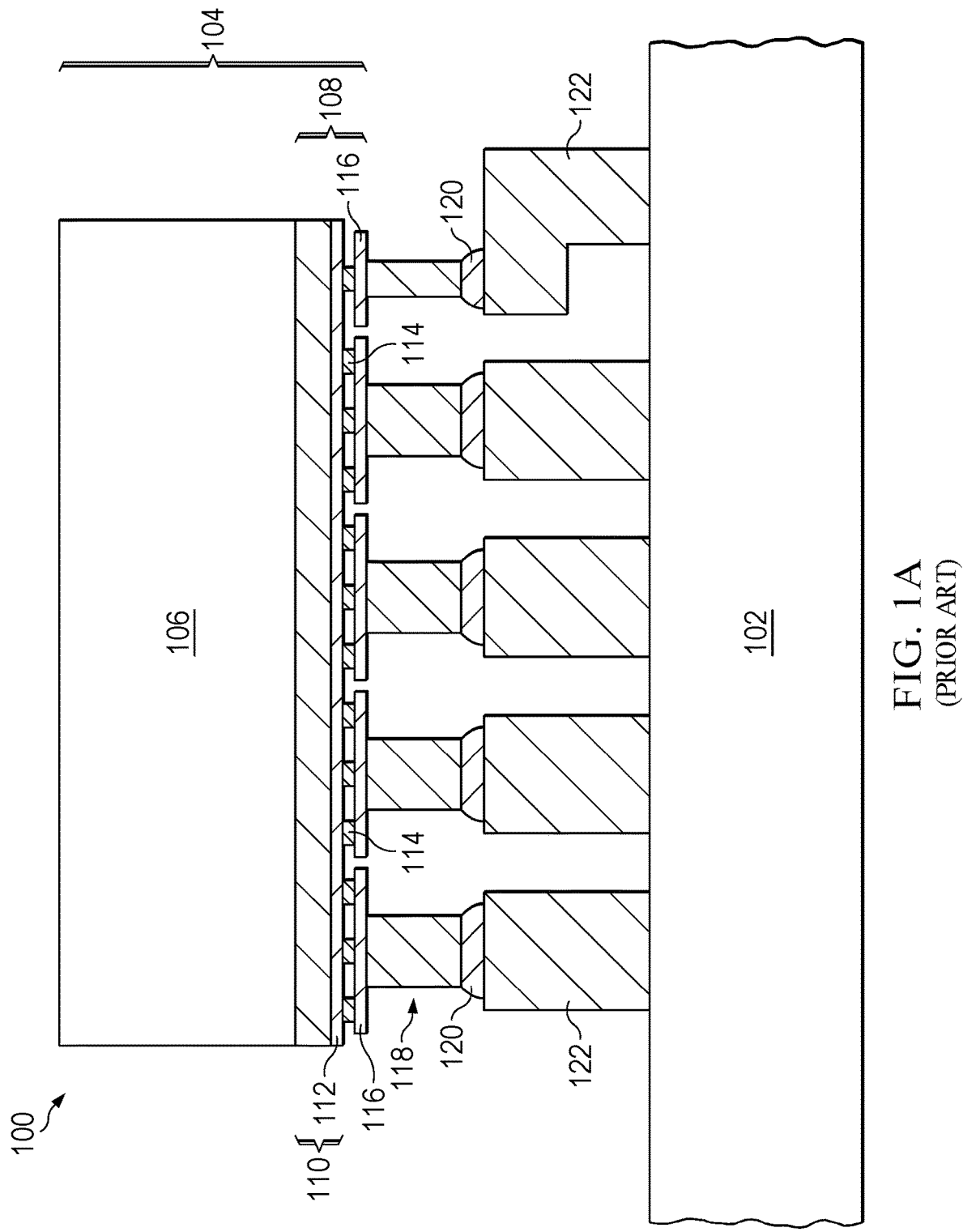
FIG. 1A is a cross-sectional view of a schematic diagram of an electronic device including a chip scale package (CSP) implementing a back end of line (BEOL) structure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Examples described herein involve a back end of line (BEOL) structure for chip scale packages (CSPs). The BEOL structure of CSPs described herein are used to improve current density of metallization layers of semiconductor dies. The BEOL structure described herein include a top metal layer with uniformly wide routings, a via layer with a different design, and an external connection design to solve the current flow pattern found in conventional CSPs. An efficient use of space in a BEOL structure decreases the size of the BEOL structure, thus decreasing the size of the CSP. Alternatively, assuming the size of the CSP remains static, an efficient use of space in the BEOL structure enables the incorporation of additional circuitry, and thus increase functionality, in the CSP.

Figure 2:
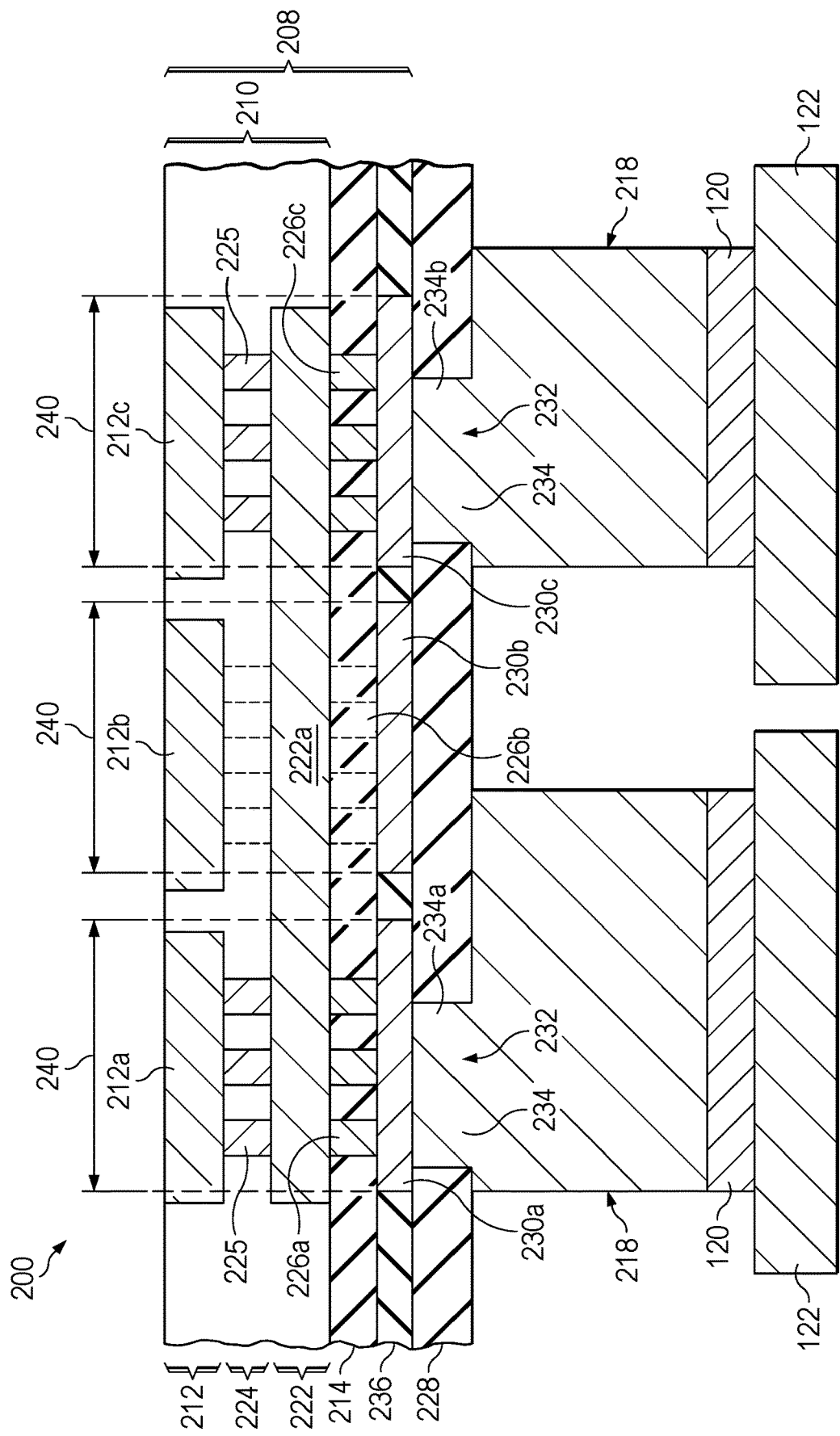
FIG. 2 is a partial cross-sectional view of a CSP with a BEOL structure, according to various examples.
Figure 3:
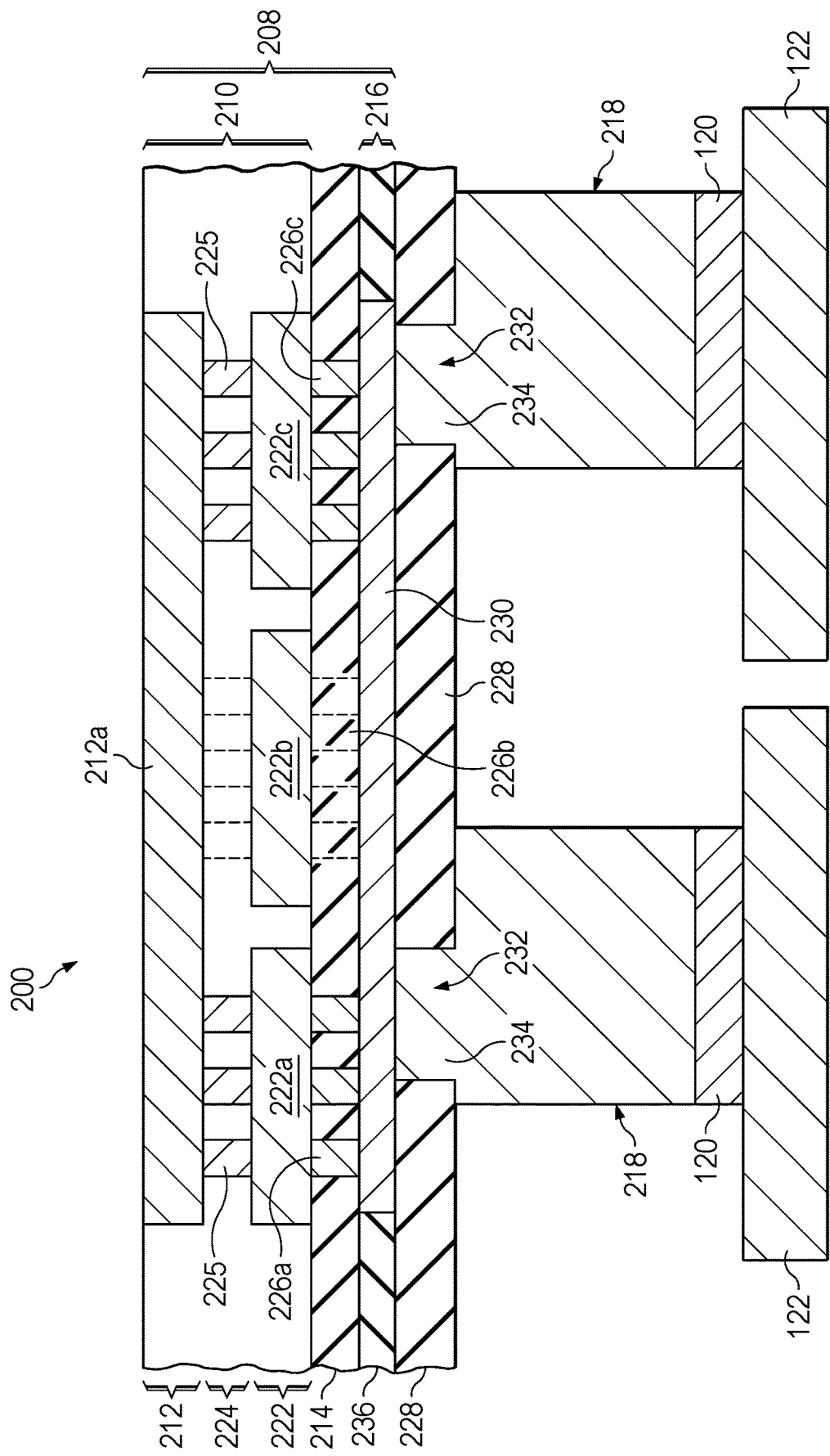
FIG. 3 is a partial cross-sectional view of a CSP with a BEOL structure, according to various examples.
Figure 4:
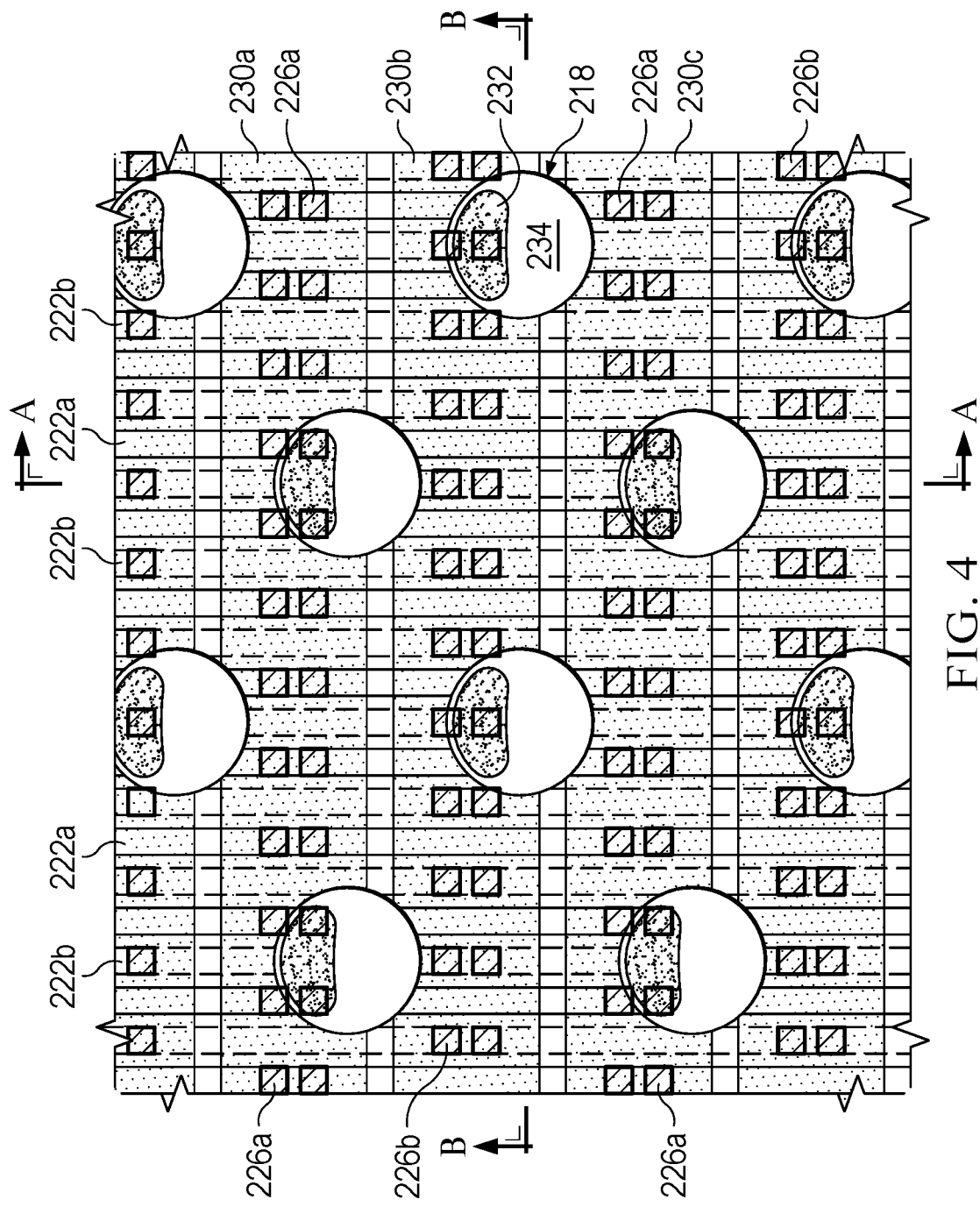
FIG. 4 is a top view illustrating a BEOL structure of a CSP, according to various examples.

FIGS. 2 and 3 show detailed cross-sectional views of a portion of the BEOL layer 208 of a CSP 200, in accordance with various examples. FIG. 4 is a top view of a portion of the BEOL layer 208 of a CSP 200 as illustrated in FIGS. 2 and 3. FIG. 2 and FIG. 3 are cross-sections taken from arrows A-A and B-B respectively shown in FIG. 4. The BEOL layer 208, the copper posts 218, the solder 120, the leadframe 122 of FIGS. 2-4 are for illustrative purposes and may not be to scale. While the entire electronic device is not shown in FIGS. 2-4, the BEOL layer 208 of FIGS. 2-4 is coupled to a semiconductor die, similar to the BEOL layer 108 of FIG. 1A coupled to the semiconductor die 106.

As illustrated, the BEOL layer 208 includes a metallization layer 210 that is configured to connect the semiconductor die (not illustrated). In one example, the semiconductor die can include a substrate, such as a silicon or silicon germanium top surface and a bottom surface. The metallization layer 210 may be discussed as being on top of the semiconductor die or as being below the semiconductor die.

Figure 1B:
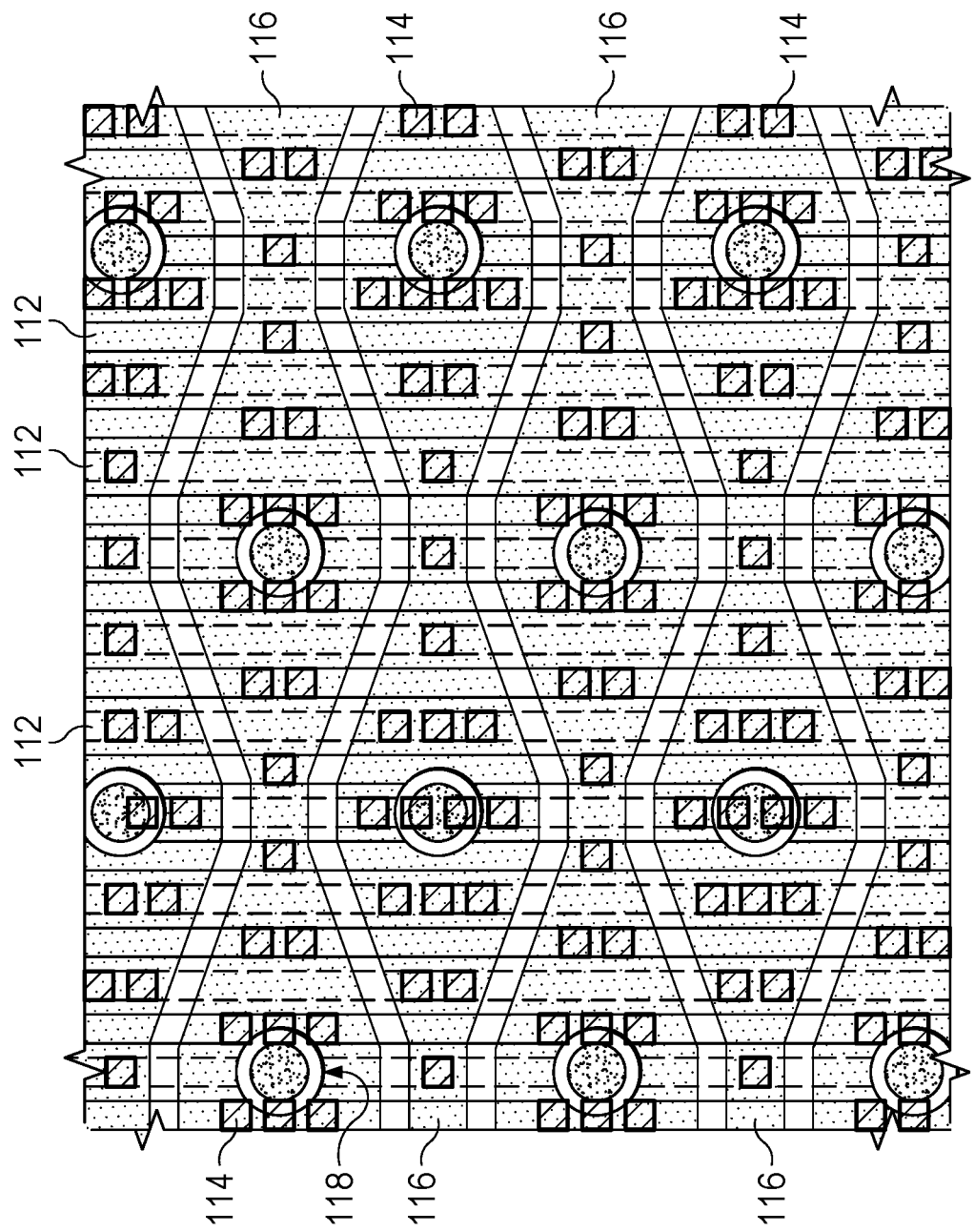
FIG. 1B is a top view of a BEOL structure of the CSP of FIG. 1A.

The metallization layer 210 of the BEOL layer 208 include a plurality of metal interconnect levels 212, 222. The plurality of metal interconnect levels 212, 222 are routed horizontally or vertically, and the different metal interconnect levels 212, 222 are routed differently. For example, a first metal interconnect level can be routed horizontally, and a second metal interconnect level (that is adjacent to the first metal interconnect level and is coupled to the first metal interconnect level) can be routed vertically. The metal interconnect levels 212, 222 can be formed from any conductive material, and generally comprise copper. The metal interconnect levels 212, 222 of the metallization layer 210 can be separated by inter-layer dielectric (ILD) layers as described further herein. The metallization layer 210 can include any number of metal interconnect levels 212, 222. For illustrative purposes, the metallization layer 210 includes a first metal layer 212 and a second metal layer 222. The first metal layer 212 of the metallization layer 210 is the metal layer that is closest metal layer to the semiconductor die 106. The second metal 222 is the metallization layer furthest from the semiconductor die. The second metal 222 can be similar to the topmost fabrication metallization layer 210 of FIGS. 1A and 1B. The metallization layer 210 can include any number of metal interconnect layers between the first metal layer 212 and the second metal layer 222.

As illustrated in FIG. 2, the first metal layer 212 of the metallization layer 210 includes multiple metal regions 212a, 212b, 212c (also referred to as metal routings). The metal regions 212a, 212b, 212c can form metal strips in the metallization layer 210. As illustrated, the metal regions 212a, 212b, 212c are coupled to different components of the semiconductor die through the metallization layer. Specifically, the metal regions 212a, 212b, 212c are coupled to the drain and the source of transistors of the semiconductor die (also referred to herein as nodes). The metal regions 212a, 212c can be coupled to the source of a transistor (not illustrated) of the semiconductor die (also referred to herein as a first node), and the metal region between the metal regions 212b can be coupled to the drain of the same transistor (not illustrated) of the semiconductor die (also referred to herein as a second node). In some examples, the metal regions 212a, 212b, 212c can be coupled to source and drains of different transistors of the semiconductor die. The metal regions 212a, 212b, 212c of the first metal layer 212 are separated by dielectric material and are isolated from each other.

While FIGS. 2 and 3 illustrates only 3 metal regions 212a, 212b, 212c, the first metal layer 212 of the metallization layer 210 can include any number of metal regions, each disposed as a part of a layer forming the first metal. The first metal layer 212 can include any number of metal regions coupled to the source of a transistor of the semiconductor die, and any number of metal regions coupled to the drain of a transistor of the semiconductor die. As illustrated in FIG. 2, the metal regions 212a, 212b, 212c can be alternatively coupled to the source and/or drain of a transistor of the semiconductor die. Because FIGS. 2 and 3 illustrates a portion of the BEOL layer 208, the first metal layer 212 can include additional metal regions adjacent to the metal regions 212a, 212b, 212c shown in FIGS. 2 and 3. Thus, an adjacent metal layer to metal region 212a and opposite of metal region 212b can also be connected to the same feature as the metal region 212b (e.g., the drain or source of a transistor of the semiconductor die).

Similarly, the second metal layer 222 of the metallization layer 210 can include multiple metal regions, as illustrated in FIG. 3 and FIG. 4. Like the first metal layer 212, the second metal layer 222 can form metal strips in the metallization layer 210, and can be coupled to different components of the semiconductor die through the metallization layer 210. Specifically, the metal regions 222a, 222b, 222c of the second metal layer 222 can be coupled to the drain and source of transistors of the semiconductor die. The metal regions 222a, 222b, 222c can be coupled to source and drains of the same or different transistors of the semiconductor die and are separated by dielectric material, thus isolated from each other. The second metal layer 222 can include any number of metal regions coupled to the source of a transistor of the semiconductor die, and the second metal layer 222 can have any number of metal regions coupled to the drain of a transistor of the semiconductor die. Like the first metal region 212, the metal regions 222a, 222b, 222c of the second metal layer 222 can be alternatively coupled to the source and/or drain of a transistor of the semiconductor die. Because FIGS. 2 and 3 illustrate a cross-sectional view of the BEOL layer 208, FIGS. 2 and 3 only illustrates three metal regions of the second metal layer 222, and the second metal layer 222 can include additional metal regions adjacent to the metal regions 222a, 222b, 222c shown in FIGS. 3 and 4. Thus, an adjacent metal layer (as illustrated in FIG. 4) to metal region 222a and opposite of metal region 222b can also be connected to the same feature as the metal region 222b (e.g., the drain or source of a transistor of the semiconductor die).

The metallization layer 210 also includes an ILD layer 224. The interlayer dielectric layer 224 is disposed between metal interconnect levels 212, 222 of the metallization layer 210. While only a single ILD layer 224 is illustrated in FIGS. 2 and 3, the metallization layer 210 can include any number of ILD layers between any number of metal interconnect levels 212, 222. For illustrative purposes, the metallization layer 210 includes one ILD layer 224 between the first metal layer 212 and the second metal layer 222. Any reference to a single ILD layer 224 can be applied to any other ILD layer. In some examples, the metallization layer 210 can include an ILD layer 224 between the first metal layer 212 and the semiconductor die 106. In some examples, because the first metal layer 212 of the metallization layer 210 is the closest metal layer to the circuitry of the semiconductor die, the metallization layer 210 can also include a pre-metal dielectric (PMD) layer (not illustrated) between the top surface of the semiconductor die 106 and the first metal layer 212 of the metallization layer 210. The ILD layer 224 can comprise ILD dielectric material between respective ones of the plurality of metal interconnect levels 212, 222. The ILD material of the ILD layer 224 can comprise a low-k or an ultra low-k dielectric layer, and be different (or the same) material for each of the ILD layers.

The ILD layer 224 includes vias 225 that connect between two adjacent metal interconnect levels 212, 222. For illustrative purposes, the ILD layer 224 couples the first metal layer 212 and the second metal layer 222. The ILD layers of the metallization layer 210 can include any number of vias, and any number of vias can connect the interconnect metal levels 212, 222. Further, the vias 225 of the ILD layer 224 can be arranged as needed to couple the metal interconnect levels 212, 222, the semiconductor die, and other features of the BEOL layer 208.

As illustrated, the BEOL layer 208 includes a dielectric layer 214 that is configured to protect the semiconductor die 106 from passivation. The dielectric layer 214 is disposed on the second metal layer 222 of the metallization layer 210. For example, the dielectric layer 214 may be composed of a suitable oxide layer, a suitable nitride layer, or any other suitable type of layer (e.g., $SiO_2$, $Si_3N_4$, SiN, SiON). The dielectric layer 214 may have any suitable thickness as may be appropriate for a given application.

The dielectric layer 214 includes multiple vias 226a, 226b, 226c (collectively referred to as vias 226) that extend through the dielectric layer 214 and that facilitate the transfer of electrical signals to and from the metallization layer 210 (and therefore, to and from the semiconductor die 106 and the rest of the BEOL layer 208). These vias 226 may be composed of a suitable conductive material, such as a metal (e.g., tungsten, copper) or a metal alloy and may have any suitable shape and size. In examples, the dielectric layer 214 is a planar dielectric layer, meaning that the thickness of the dielectric layer 214 is approximately uniform throughout. As used herein, a substantially uniform thickness is a thickness with no more than 1 micron of variation in thickness from the thickest to the thinnest segments. The top and bottom surfaces of the vias 226 are approximately flush with the top and bottom surfaces, respectively, of the dielectric layer 214. As used herein, the term approximately flush means flush within a margin of plus or minus 1 micron.

The vias 226 of the dielectric layer 214 are coupled to the metallization layer 210, specifically to the second metal layer 222, and are arranged in groups to couple to the multiple routings of the second metal layer 222. As illustrated, the vias 226 include vias 226a, 226b coupled to metal regions 222a, 222c of the second metal layer 222, respectively, and the dielectric layer 214 also includes vias 226b (shown in dotted lines) that are coupled to metal regions 222b, but a different position of the dielectric layer 214. As mentioned, FIGS. 2 and 3 are partial cross-sectional views of the BEOL layer 208, and the cross-section shown in FIGS. 2 and 3 do not include vias coupled to the metal region. However, other cross-sections of the BEOL layer have vias 226 of the dielectric layer 214 coupled to the metal region 222b of the second metal layer 222.

Specifically, the vias 114 are grouped at intersections between the routings of the top metal layer 116 and the regions of the top-most fabrication metallization layer 112. For a particular routing of the top metal layer 116, the vias 114 are disposed to couple to a set of routings (or regions) of the top-most fabrication metallization layer (e.g., routing 222a, 222c) and a set of routings (or regions) of the top metal layer 216. The top metal layer is further discussed herein.

As illustrated in FIG. 2-4, the BEOL layer 208 includes a top metal layer 216 disposed on the dielectric layer 214. The top metal layer 216 includes multiple metal routings 230a, 230b, 230c (collectively referred to as routings 230) (also referred to as regions) as illustrated in FIG. 2 and FIG. 4. The routings 230 are separated from each other by dielectric material and are isolated from each other. The top metal layer 216 can be routed horizontally or vertically, and the top metal layer 216 is routed differently compared to the top-most metal interconnect layer. For example, the topmost metal interconnect layer can be routed horizontally, and the top metal layer 216 (that is adjacent to the topmost metal interconnect layer and is coupled to the topmost metal interconnect layer) can be routed vertically. In some examples, a reference to a single routing of the routings 230 of the top metal layer 216 can refer to or apply to any of the routings 230 of the top metal layer 216. As FIG. 3 illustrates a partial cross-sectional view of the BEOL layer 208, FIG. 3 illustrates a cross-section of a routing of the top metal layer 216. Like other metal layers (e.g., metal interconnect layers 212, 222 of the metallization layer 210), the top metal layer 216 (and its respective routings) is coupled to vias 226 of the dielectric layer 214, and is in turn coupled to the metallization layer 210 and the semiconductor die. While not drawn to scale in FIGS. 2 and 3, the top metal layer 216 is also thicker than the metal interconnect levels 212, 222 of the metallization layer 210. For example, the top metal layer 216 has a thickness between 1 um and 20 um, while a metal interconnect level of the metallization layer 210 (e.g., second metal layer 222) has a thickness between 0.3 um and 3 um.

The top metal layer 216 is coupled to the vias 226 of the dielectric layer 214, and the routings 230 of the top metal layer 216 are coupled to the semiconductor die by the vias 226 of the dielectric layer 214 and the metallization layer 210. Because of the coupling to the semiconductor die, the routings of the top metal layer 216 are coupled to either a source voltage or a drain voltage of a transistor of the semiconductor die. The vias 226 pick up current from the top-most metal interconnect level and passes the current to corresponding routings of the top metal layer 216, which is much thicker than the topmost metal interconnect level to reduce current accumulation in the topmost metal interconnect level. Depending on the spacing between the vias 226, current can travel a further distance on the thinner metal interconnect levels, which results in increased current density. Increased current density in the topmost metal interconnect level results in increased resistance, joule heating, and ultimately reduced EM and thermal performance.

As mentioned, the vias 226 of the dielectric layer 214 are arranged in groups to couple to the multiple routings 230 of the second metal layer 222. Similarly, the vias 226 are also arranged in groups to couple to the routings of the top metal layer 216. Accordingly, the vias 226 of the dielectric layer 214 are arranged to couple the multiple routings of the second metal layer 222 and the routings 230 of the top metal layer 216 at intersections of the routings of the second metal layer 222 and the routings of the top metal layer 216. As illustrated, for a particular routing of the top metal layer 216, the vias 226 coupled to this particular routing of the top metal layer 216 are coupled to only one set of routings of the second metal layer 222 (i.e., routings of the second metal layer 222 coupled to the drain voltage, routings of the second metal layer 222 coupled to the source voltage). Further, while one routing of the top metal layer 216 is coupled to the one feature of the semiconductor die (e.g., the source of a transistor of the semiconductor die), the adjacent routing of the top metal layer 216 is coupled to another feature of the semiconductor die (e.g., the drain of a transistor of the semiconductor die). While FIG. 4 shows only two vias coupled each routing of the second metal layer 222 per routing of the top metal layer 216, any number of vias 226 can be grouped together to couple each routing of the second metal layer 222 to a corresponding routing of the top metal layer 216.

As illustrated in FIG. 4, the top metal layer 216 has a uniform width across each of its routings. Unlike the sinusoidal shape or wave shape of the routings of the top metal layer 116 of FIG. 1, the routings of the top metal layer 216 have a rectangular shape. The sides of the routings of the top metal layer 216 are linear, and are not nonlinear like the routings of the top metal layer 116 of FIG. 1. While FIG. 4 illustrates four routings of the top metal layer 216, the top metal layer 216 can include any number of routings, and the routings of the top metal layer 216 have linear sides.

The BEOL layer 208, in some examples, can include a dielectric layer 236 disposed on the dielectric layer 214. The dielectric layer 236 abuts portions of the dielectric layer 214 and the top metal layer 216 and its routings. Like the dielectric layer 214, the dielectric layer 236 is configured to protect the semiconductor die 106 from passivation. The dielectric layer 236 may be composed of a suitable oxide layer, a suitable nitride layer, or any other suitable type of layer (e.g., $SiO_2$, $Si_3N_4$, SiN, SiON). The dielectric layer 236 may have any suitable thickness as may be appropriate for a given application. As illustrated, the surface of the dielectric layer 236 opposite the dielectric layer 214 is flush with the surface of the top metal layer 216. In some examples, the dielectric layer 236 is a part of the dielectric layer 214.

In examples, the BEOL layer 208 further includes an insulation layer 228 (e.g., polyimide, polybenzoxazole benzocyclobutene) that abuts portions of the dielectric layer 236, and the top metal layer 216 and its routings. The insulation layer 228 isolates the electrical signals from the semiconductor die and the BEOL layer 208 to ensure that external connections are established with the top metal layer 216 and its routings properly. In some examples, the insulation layer 228 has a thickness of between 5 um and 15 um. The physical dimensions, including various lengths, widths, and thicknesses, of the insulation layer 228 and the metal contact 234 of copper posts 218 may vary as appropriate for a given application.

The insulation layer 228 includes openings 232 that selectively exposes the top metal layer 216 and the routings thereof. As illustrated, the openings 232 of the insulation layer 228 exposes the top metal layer 216 and its routings to copper posts 218 having metal contacts 234a, 234b that establishes connections to external devices, which is further disclosed herein. In examples, the opening 232 has a maximal horizontal size of less than 100 microns.

A selective opening 232 generally enables a more efficient use of space in the BEOL layer 208, because a selective opening 232 facilitates the uniform width of the routings of the top metal layer 216. Because the selective opening 232 exposes only a specific routing of the top metal layer 216, the size, width, and shape of the routings of the top metal layer 216 can be sized and shaped to fit any needs of the semiconductor die or of external connections to the device. Further, the selective opening 232 allows the copper posts 218 to be positioned to vertically overlap with routings of the top metal layer 216 but not be coupled to those routings of the top metal layer 216.

Another benefit of a narrower opening 232 is that it enables flexibility of design by miniaturization of the opening 232 of the insulation layer 228. The narrower the opening 232, the more efficient the topology of the BEOL layer 208. However, reducing the diameter of a conductor can reduce its current throughput. Accordingly, narrowing the opening 232 can restrict current flow through the opening 232. Current flow can also be restricted by electromigration effects at the interface of copper posts 218 (and the metal contacts 234 of the copper posts 218), and such effects may be more restrictive on current flow than the size of the opening 232, meaning that these effects are the bottleneck on current flow, not the opening 232. However, it is possible that the opening 232 can be narrowed to such a degree that the opening 232 becomes the primary restriction on current flow (e.g., the bottleneck). Thus, the specific maximal horizontal size of the opening 232 may in some examples be chosen based on the current flow restrictions imposed by the aforementioned electromigration effects.

The CSP 200 also includes copper posts 218, each copper post 218 including a metal contact 234. Because the copper post 218 comprises copper, the metal contact 234 can also comprise copper. However, in some examples, the metal contact 234 and/or the copper post 218 can comprise at least one of copper, titanium, tungsten, and/or nickel. The metal contact 234 of the copper posts 218 are disposed in the openings 232 of the insulation layer 228, and are disposed on the insulation layer 228. The metal contact 234 of the copper posts 218 facilitates connections between the copper posts 218 and the routings of the top metal layer 216 through the openings 232 of the insulation layer 228.

The insulation layer 228 and the metal contact 234 are patterned to implement a topology that establishes desired connections between the copper posts 218 and the top metal layer 216 and its routings. In examples, the metal contact 234 facilitate the transfer of electrical signals, and the insulation layer 228 insulates routings of the top metal layer 216 from each other, as shown. The metal contact 234 couples to the routings of the top metal layer 216 via the opening 232 of the insulation layer 228.

Figure 5:
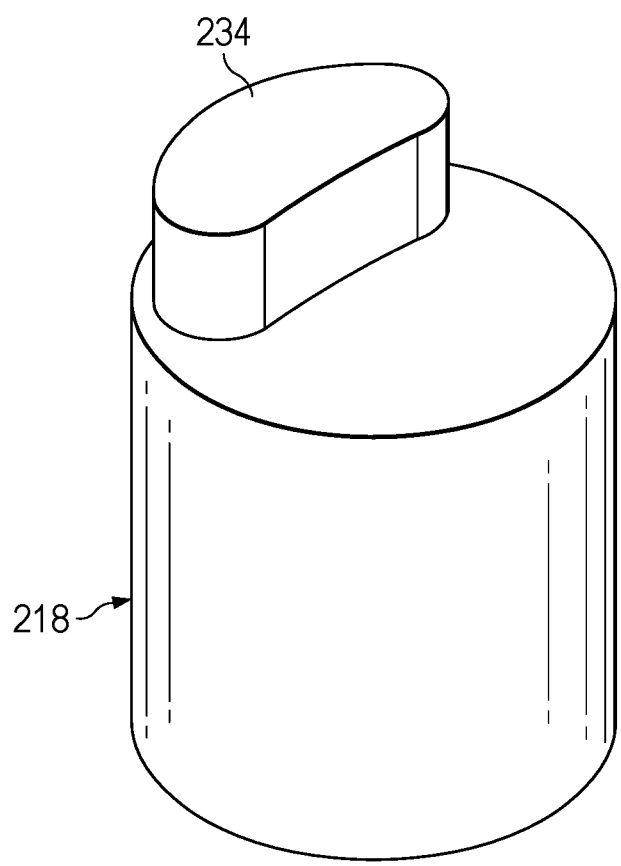
FIG. 5 is a top view of a copper post implemented with the selective insulation layer of a BEOL structure, according to various examples.

FIG. 5 illustrates a copper post implemented with the insulation layer 228 of a BEOL layer 208 of FIGS. 2-4, according to various examples. The copper post 218, as illustrated in FIG. 5, includes the post 218 itself and the respective metal contact 234 that couples to the top metal layer 216 through the opening 232 of the insulation layer 228. While the metal contact 234 shown in FIG. 5 is has a semi-circle shape, the metal contact 234 can have any size or shape, so long as the metal contact 234 of the copper posts 218 couples to the top metal layer 216 through an opening 232 of the insulation layer 228. The selective opening 232 of the insulation layer 228, itself, has an area smaller than a top surface (i.e., the surface that couples to the top metal layer 216 via the metal contact 234) of the copper post 218.

As illustrated in FIG. 2-4, the copper posts 218 are, in turn coupled to solder 120 and the leadframe 122. The copper posts 218 of FIGS. 2 and 3 are similar to the copper posts 118 of FIG. 1A, and the solder 120 and leadframe 122 can be the same solder 120 and leadframe 122 of FIG. 1A.

Figure 6:
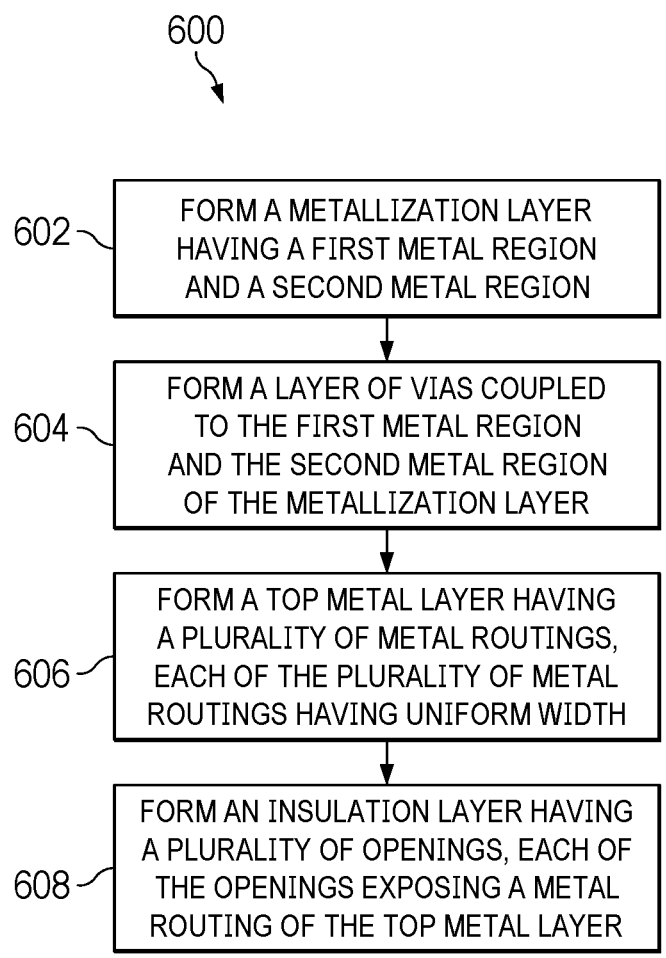
FIG. 6 is a flowchart illustrating operations for forming a CSP with a BEOL structure, according to various examples

FIG. 6 is a flowchart illustrating a method of operations for forming a CSP with a BEOL layer, according to various examples. For illustrative purposes, FIG. 7-10 are top views illustrating various layers of a CSP with a BEOL structure during the method of operations of FIG. 6, according to various examples.

Figure 7:
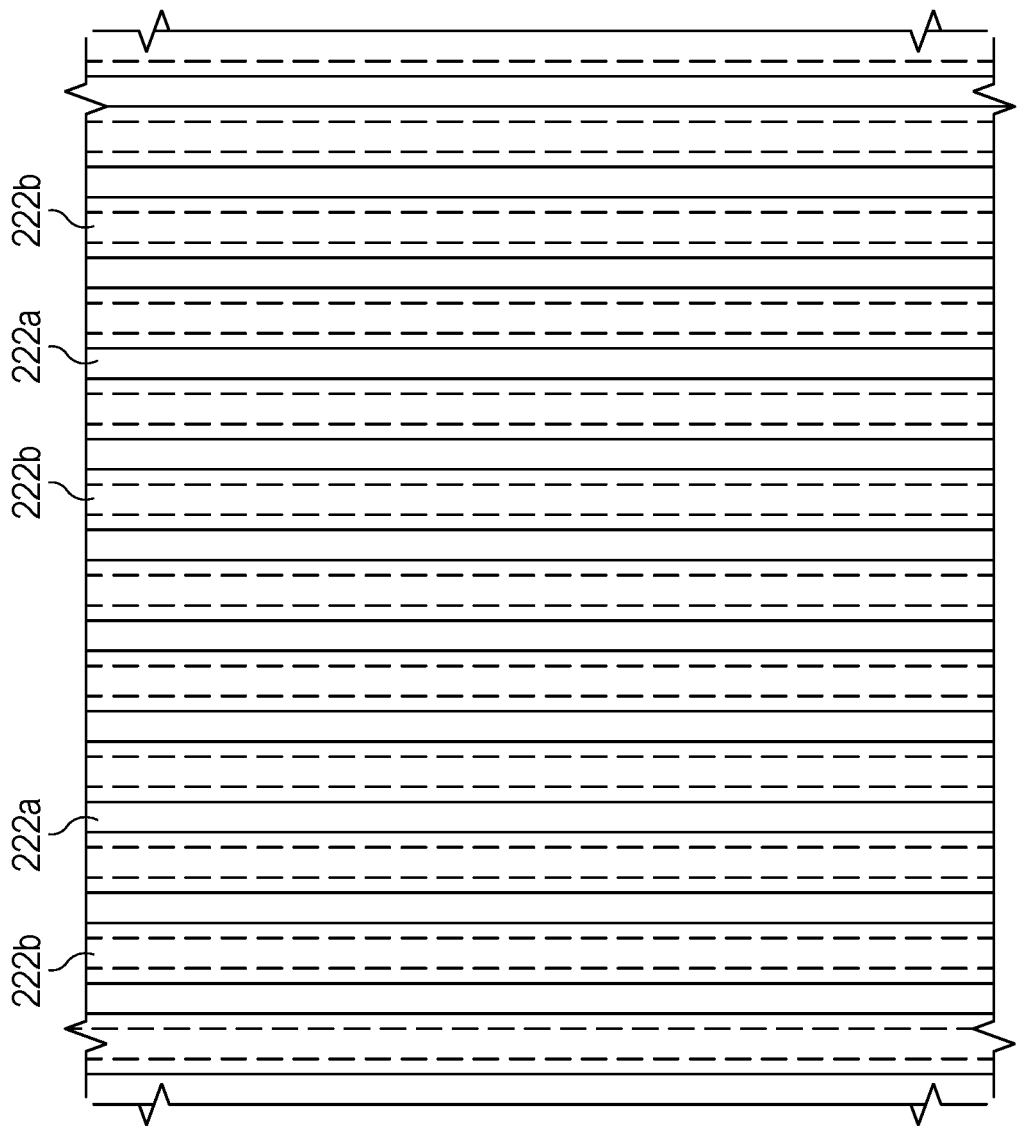
FIGS. 7-10 are top views illustrating various layers of a CSP with a BEOL structure, according to various examples.

The method 600 begins with step 602 involving forming a fabrication metallization layer (e.g., metallization layer 210) on a semiconductor die, the fabrication metallization layer 222 having a source region 222a and a drain region 222b. FIG. 6 is a top view of a top layer of a metallization layer of a CSP (e.g., with a BEOL structure, according to various examples. The fabrication metallization layer 222 of FIG. 7 can be the top-most metallization layer 222 of FIGS. 2-4. As illustrated in FIG. 7, the fabrication metallization layer 222 includes source region 222a and a drain region 222b. The source region 222a and the drain region 222b of the fabrication metallization layer 222 is coupled to a source of a transistor of a semiconductor die, and a drain of a transistor of a semiconductor die respectively. The fabrication metallization layer 222 includes multiple metal regions (also referred to as routings), as illustrated, and the metal regions form the source region 222a and the drain region 222b. The routings of the source region 222a and the drain region 222b of the fabrication metallization layer 222 alternate as disposed in the metallization layer 210. For example, a routing of the source region 222a is adjacent to a routing of the drain region 222b, and vice versa. Forming the fabrication metallization layer 222 can involve conventional BEOL processing of metallization layers. The fabrication metallization layer 222 can comprise copper, aluminum, or any other conductive material.

In some examples, forming the fabrication metallization layer 222 can involve forming other fabrication metallization layers underneath the fabrication metallization layer 222. As mentioned, the fabrication metallization layer 222 is the top-most fabrication metallization layer 222 of a metallization layer 210 disposed on a semiconductor die (also the fabrication metallization layer furthest away from the semiconductor die). Accordingly, to form the fabrication metallization layer 222 as illustrated in FIG. 7, other fabrication metallization layers (e.g., first metal layer 212 of FIGS. 2 and 3) of a metallization layer (e.g., metallization layer 210 of FIGS. 2-4). Forming other fabrication metallization layers can involve conventional BEOL processing of metallization layers. The arrangement of these other fabrication metallization layers can be formed as described herein. These other fabrication metallization layers can comprise copper, aluminum, or other conductive materials.

Further, in examples, forming the fabrication metallization layer 222 can involve forming ILD layers (e.g., ILD layer 224 of FIG. 2-3) between the fabrication metallization layers 212, 222 of the metallization layer 210, forming vias 225 in the ILD layers to couple fabrication metallization layers 212 of the metallization layer 210. Forming the vias 225 in ILD layers 224 between fabrication metallization layers 222 can involve using a photolithography process to form orifices that are filled with a suitable seed layer and plated to form vias 225 (e.g., using copper).

Figure 8:
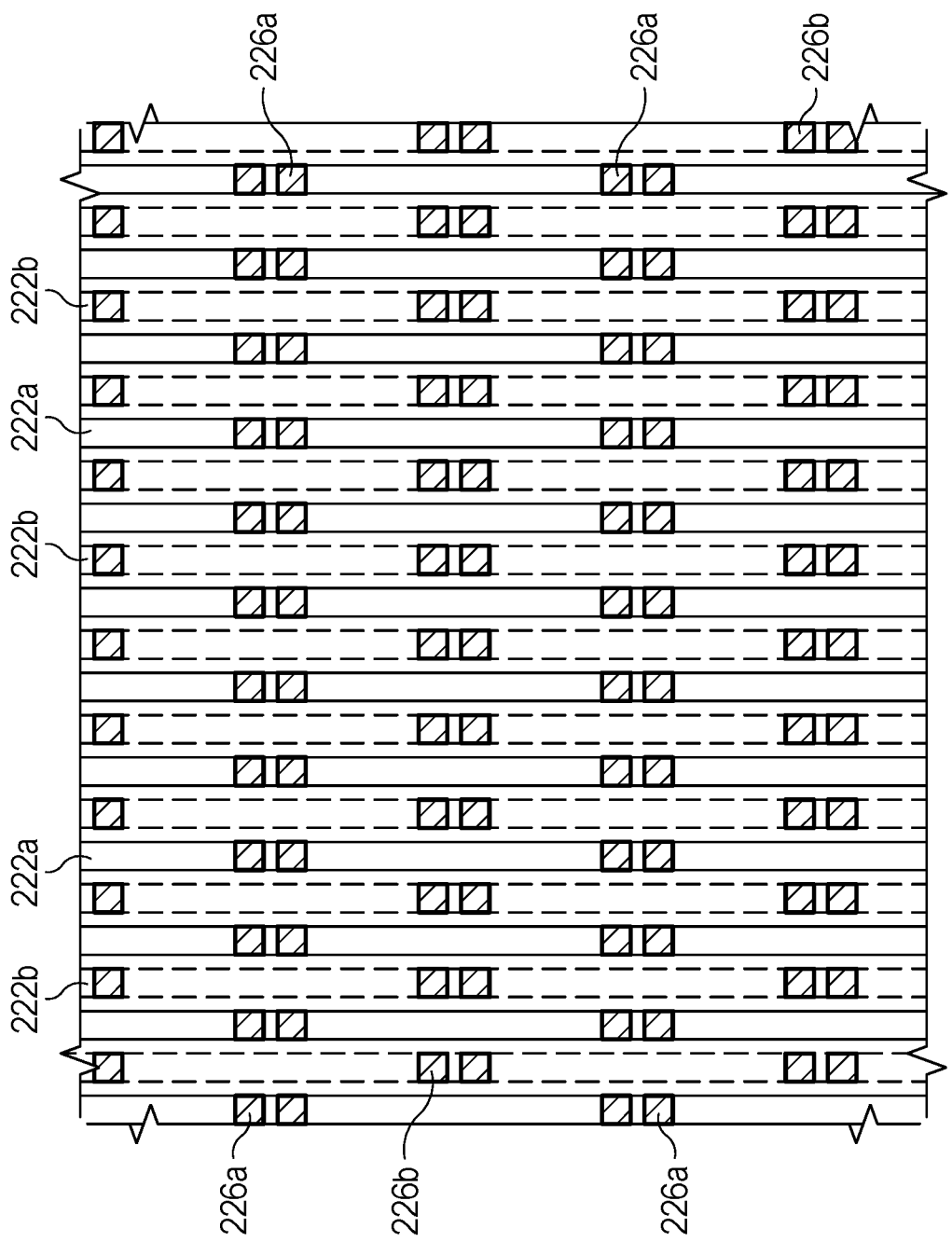

The method 600 continues with step 604 involving forming a layer of vias (e.g., layer of vias 226) coupled to the metallization layer (e.g., metallization layer 210). FIG. 8 is a top view of a layer of vias 226 coupled to a metallization layer 210. As described above, a dielectric layer (not illustrated in FIG. 8, illustrated in FIGS. 2 and 3) is formed on fabrication metallization layer 222. Vias 226 are then formed into the dielectric layer 214 according to the pattern and/or arrangement of routings of the source region 222a and the drain region 222b of the fabrication metallization layer 222. In some examples, the vias 226 are also formed based on the planned pattern and/or or arrangement of routings of the top metal layer (e.g., routings 230 of the top metal layer 216 of FIG. 2-4). Accordingly, the vias 226 within the dielectric layer 214 connect the top level of the metallization layer 210 (e.g., fabrication metallization layer 222) and the top metal layer 216 overlaying the dielectric layer 214.

Forming the vias 226 in a dielectric layer 214 can involve using a photolithography process in the dielectric layer 214 to form orifices that are filled with a suitable seed layer and plated to form the vias 226 (e.g., using copper). Photolithography processes form the patterns in the resist layer that indicate the arrangement and pattern of the vias 226 in a dielectric layer 214.

Figure 9:
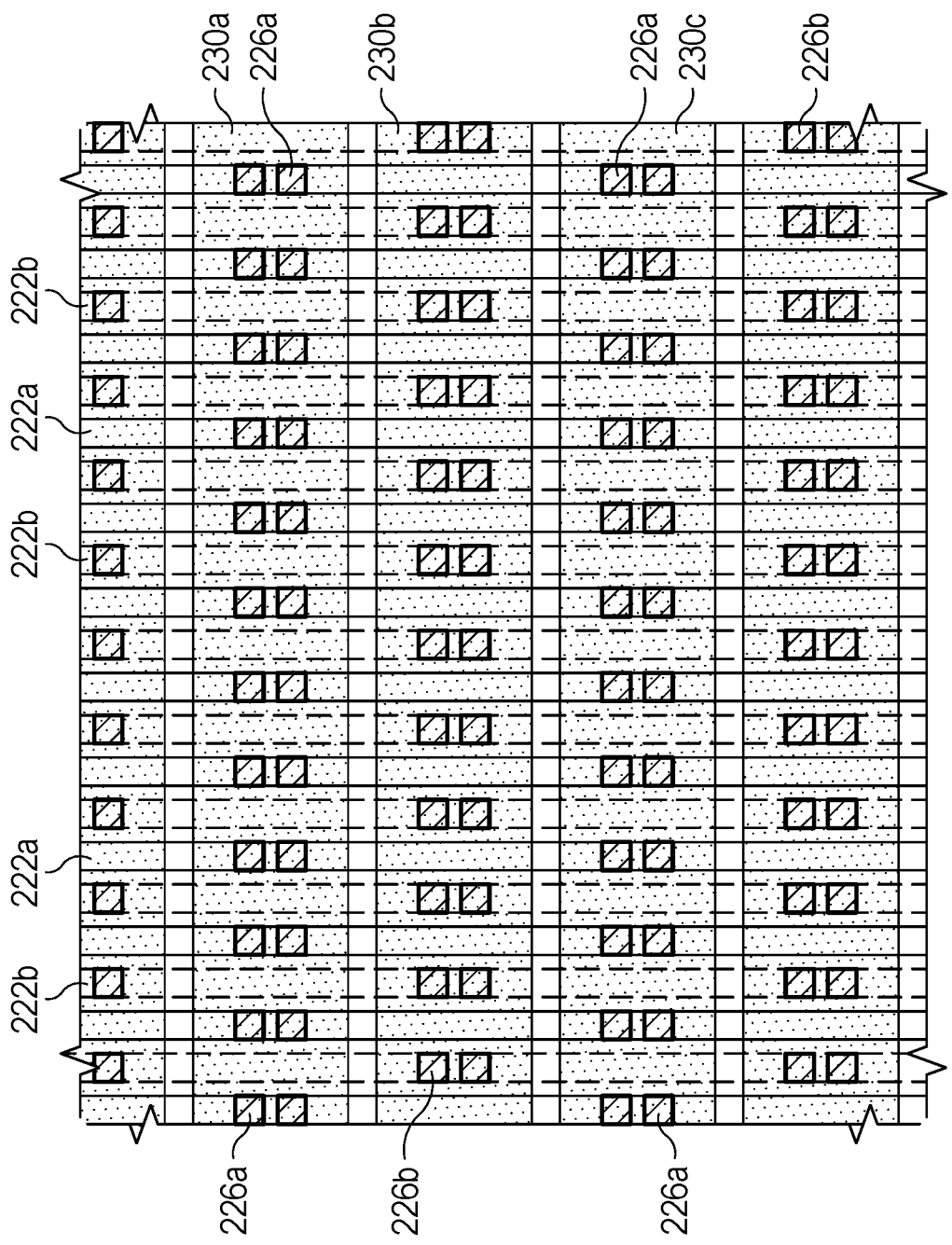

The method 600 continues with step 606 involving forming a top metal layer (e.g., top metal layer 216) on the layer of vias 225, according to some examples. The top metal layer formed is the top metal layer 216 of FIG. 9. The top metal layer 216 is formed on the dielectric layer 214 and the layer of vias 225. Forming the top metal layer 216 involves forming multiple routings on the dielectric layer 224 and the layer of vias 225 as illustrated in FIG. 9. The top metal layer 216 can comprise aluminum (or an aluminum alloy) or copper.

Forming the top metal layer 216 involves depositing a seed layer and the application of a resist layer. Photolithography processes form the patterns in the resist layer that indicate the arrangement and pattern of the routings of the top metal layer 216. After forming the resist layer that indicates the arrangement and pattern of the routings of the top metal layer 216, forming the top metal layer 216 involves using plating metal layers and removing the resist layer. The resulting routings of the top metal layer 216 abuts the vias 226 of the dielectric layer 214.

In some examples, the method 600 involves forming a dielectric layer 236 on top of the dielectric layer 214, so that the dielectric layer 236 is flush or level with the top metal layer 216. The dielectric layer 236 abuts portions of the dielectric layer 214 and the top metal layer 216 and its routings. The surface of the dielectric layer 236 opposite the dielectric layer 214 is flush with the surface of the top metal layer 216. In some examples, the dielectric layer 236 is a part of the dielectric layer 214. In some examples, the top metal layer 216 is formed after forming the dielectric layer 236.

The method 600 continues with step 608 involving forming an insulation layer (e.g., insulation layer 228) on the routings of the top metal layer (e.g., top metal layer 216) and the dielectric layer 236. Forming the insulation layer on the routings of the top metal layer and the dielectric layer 236 can involve using photolithography to apply an insulation layer (e.g., insulation layer 228). As described herein, the insulation layer 228 abuts the routings of the top metal layer 216 and abuts the surface of the dielectric layer 236 opposite the dielectric layer 214. The insulation layer 228 may also be a protective overcoat layer. The insulation layer 228 can comprise silicon oxide, silicon nitride, SiON, polyimide, or polybenzoxazole benzocyclobutene.

Forming the insulation layer 228 on the routings of the top metal layer 216 and the dielectric layer 236 can involve patterning the insulation layer to expose openings for a metal contact 234a, 234b of a copper post 218.

Figure 10:
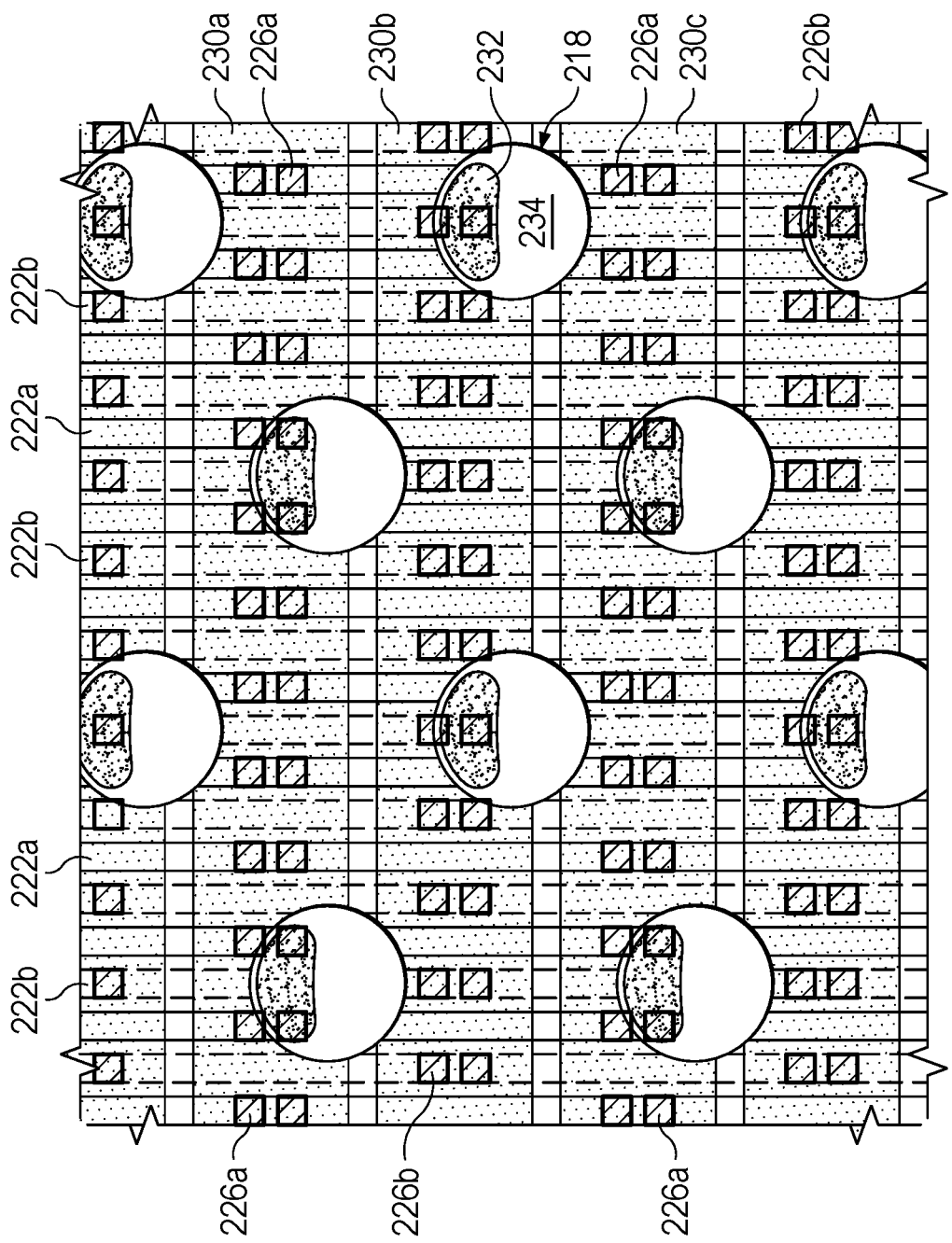

The method 600 includes forming a copper post coupled to the routings of the top metal layer 216 (step not illustrated). FIG. 10 illustrates the copper posts coupled to the routings 230 of the top metal layer 216. As described above, the copper posts 218 are coupled to the top metal layer 216 via a metal contact 234 of the copper posts 218 disposed in an opening (e.g., opening 232) in the insulation layer (e.g., insulation layer 228). In some examples, instead of forming a copper post 218, the method 600 includes depositing a solder ball. In such examples, the solder ball may be used to couple the example CSP to a leadframe (e.g., leadframe 122 of FIG. 2-3), which in turn is coupled to any suitable electronic device, such as a PCB (e.g., PCB 102 of FIG. 1A).

The term "couple" is used throughout the specification. The term may cover connections, communications, or signal paths that enable a functional relationship consistent with the description of this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party. Unless otherwise stated, "about," "approximately," or "substantially" preceding a value means+/−10 percent of the stated value. Modifications are possible in the described examples, and other examples are possible, within the scope of the claims.

While the foregoing is directed to specific examples, other and further examples may be devised without departing from the basic scope thereof, and the scope thereof is determined by the claims that follow.

What is claimed is:

1. A semiconductor device, comprising:
   a metal fabrication layer disposed on a substrate, the metal fabrication layer having a first metallization region and a second metallization region;
   a dielectric layer having a first plurality of vias aligned with the first metallization region of the metal fabrication layer and a second plurality of vias aligned with the second metallization region of the metal fabrication layer, the dielectric layer disposed on top of the metal fabrication layer;
   a metal layer disposed on the dielectric layer, the metal layer having a plurality of metal routings, each of the plurality of metal routings disposed over both the first metallization region of the metal fabrication layer and the second metallization region of the metal fabrication layer, each of the plurality of metal routings has a same width; and
   an insulation layer disposed on the metal layer, the insulation layer having a plurality of openings to the plurality of metal routings of the metal layer.

2. The semiconductor device of claim 1, wherein the first metallization region is coupled to a first node, and the second metallization region is coupled to a second node.

3. The semiconductor device of claim 1, further comprising a plurality of copper posts, each copper post coupled to a metal routing of the plurality of metal routings of the metal layer.

4. The semiconductor device of claim 3, wherein each of the plurality of copper posts comprises a metal contact coupled to the respective metal routing through a respective opening of the plurality of openings of the insulation layer.

5. The semiconductor device of claim 4, wherein each opening comprises an area less than a surface area of the respective copper post.

6. The semiconductor device of claim 4, wherein the metal contact is disposed in the respective opening, and each copper post contacts the insulation layer.

7. The semiconductor device of claim 1, wherein the first plurality of vias comprises a first subset of vias and a second subset of vias, the first subset of vias disposed under a first metal region of the plurality of metal routings, the second subset of vias disposed under a second metal region of the plurality of metal routings, the second metal region separated from the first metal region by a third metal region, and wherein spacing between the first subset of vias and the second subset of vias is greater than a width of the first metal region.

8. The semiconductor device of claim 7, wherein the spacing between the first subset of vias and the second subset of vias is greater than 90 um.

9. The semiconductor device of claim 1, wherein the first plurality of vias comprises a first subset of vias and a second subset of vias, wherein the first metallization region comprises a first metallization subregion and a second metallization subregion, the first subset of vias coupled to the first metallization subregion, the second subset of vias coupled to the second metallization subregion, the first subset of vias and the second subset of vias coupled to a same metallization region of the metal layer, the first metallization subregion and the second metallization subregion separated by the second metallization region, and wherein a number of vias of the first subset of vias is equal to a number of vias of the second subset of vias.

10. The semiconductor device of claim 1, wherein the first plurality of vias are disposed at intersections between the plurality of metal routings and the first metallization region.

11. The semiconductor device of claim 1, wherein each of the plurality of metal routings of the metal layer comprises a width of 58 um.

12. The semiconductor device of claim 1, wherein sides of each of the plurality of metal routings are linear.

13. The semiconductor device of claim 1, wherein a thickness of the metal fabrication layer is smaller than a thickness of the metal layer.

* * * * *